United States Patent
Bartko

(10) Patent No.: US 10,554,316 B2
(45) Date of Patent: Feb. 4, 2020

(54) MEASURING SYSTEM AND MEASURING METHOD FOR CALIBRATING AN ANTENNA ARRAY

(71) Applicant: Rohde & Schwarz GmbH & Co. KG, Munich (DE)

(72) Inventor: Hendrik Bartko, Unterhacting (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 216 days.

(21) Appl. No.: 15/453,551

(22) Filed: Mar. 8, 2017

(65) Prior Publication Data

US 2018/0262279 A1 Sep. 13, 2018

(51) Int. Cl.
*H04B 17/12* (2015.01)
*G01R 29/10* (2006.01)

(52) U.S. Cl.
CPC ............. *H04B 17/12* (2015.01); *G01R 29/10* (2013.01)

(58) Field of Classification Search
CPC ....... H04B 17/12; H04B 17/103; G01R 29/10
See application file for complete search history.

(56) References Cited

U.S. PATENT DOCUMENTS

| 5,511,010 A * | 4/1996 | Burns | G01R 19/25 324/615 |
| 2011/0235761 A1* | 9/2011 | Oren | H04L 25/0204 375/350 |
| 2013/0257454 A1* | 10/2013 | Mow | H01Q 9/0421 324/619 |
| 2018/0198537 A1* | 7/2018 | Rexberg | H01Q 1/243 |

FOREIGN PATENT DOCUMENTS

| DE | 4106132 A1 | 9/1992 |
| WO | 2013174807 A1 | 11/2013 |

* cited by examiner

*Primary Examiner* — Akm Zakaria
(74) *Attorney, Agent, or Firm* — Ditthavong & Steiner, P.C.

(57) ABSTRACT

A measuring system for calibrating an antenna array is provided. A parameter setting unit modifies an input signal of a first antenna or a first antenna group, using operating parameters. A signal generator generates a first measuring signal and provides it to the parameter setting unit and to a second antenna or a second antenna group of the antenna array. A measuring antenna receives a second measuring signal composed of a signal emitted by the first antenna or first antenna group and a signal emitted by the second antenna or second antenna group. A power meter measures the power of the second measuring signal. An evaluation device determines a measured interference signal from the measured power of the second measuring signal, and preferably also determines the operating parameters used by the parameter setting unit based upon the measured interference signal and position information.

16 Claims, 3 Drawing Sheets

MEASURING SYSTEM AND MEASURING METHOD FOR CALIBRATING AN ANTENNA ARRAY

TECHNICAL FIELD

The invention relates to a measuring system and a measuring method for performing a calibration of an antenna array, especially of an antenna array comprising a plurality of antennas, which are each individually adjustable in phase and/or amplitude.

BACKGROUND ART

For calibrating an antenna array, comprising a plurality of individual antennas, so far, a complex measurement regarding phase and amplitude of each individual antenna channel was necessary. This resulted in very costly measuring systems and very long measuring times.

For example, the international patent application WO 2013/174807 A1 shows a measuring system, in which the amplitude and phase of each individual antenna of the antenna array are measured.

There is a need to provide a measuring system and measuring method for calibrating an antenna array, which requires only low-cost hardware and only requires a low measuring time.

SUMMARY OF THE INVENTION

According to a first aspect of the invention, a measuring system for calibrating an antenna array is provided. The measuring system comprises a parameter setting unit adapted to modify an input signal of a first antenna or a first antenna group of the antenna array, by use of operating parameters. Moreover, the measuring system comprises a signal generator, which is adapted to generate a first measuring signal and provide it to the parameter setting unit and to a second antenna or a second antenna group of the antenna array. Furthermore, the measuring system comprises a measuring antenna, which is adapted to receive a second measuring signal composed of a signal emitted by the first antenna or the first antenna group and a signal emitted by the second antenna or the second antenna group. Moreover, the measuring system comprises a power meter, connected to the measuring antenna, adapted to measure the power of the second measuring signal. The measuring system furthermore comprises an evaluation device, which is adapted to determine a measured interference signal from the measured power of the second measuring signal.

Preferably the evaluation device is also adapted to determine the operating parameters used by the parameter setting unit based upon the measured interference signal and position information. The position information comprises position information of the first antenna or the first antenna group, the second antenna or the second antenna group and the measuring antenna. It is thereby possible to calibrate the first antenna of the antenna array without requiring the measurement of a phase. This significantly reduces the measuring hardware cost and the measuring time.

According to a first preferred implementation form of the first aspect, the parameter setting unit comprises an amplitude adjuster, adapted to adjust an amplitude of the first measuring signal or a signal derived from the first measuring signal. Additionally or alternatively, the parameter setting unit comprises a phase adjuster, adapted to adjust a phase of the first measuring signal or a signal derived from the first measuring signal. Therefore, the operating parameters are the amplitude and the phase. This allows for a thorough calibration of the first antenna of the antenna array.

According to a second implementation form of the first aspect, at least one of the at least one measuring antennas is moveable. Alternatively or additionally, the measuring system comprises more than one measuring antenna. In these cases, it is possible to determine the interference signal for a plurality of locations of the measuring antenna or antennas. This increases the accuracy of the calibration.

According to a further preferred implementation form of the first aspect, the measuring system is adapted to perform measurements for each measuring antenna position and/or for each measuring antenna. Additionally, the evaluation device is then adapted to determine the operating parameters based upon results of all of these measurements. Therefore, a significant increase in calibration accuracy can be achieved.

According to a further preferred implementation form of the first aspect, the evaluation device is adapted to determine a phase operating parameter based upon the position information and an ideal interference signal. This allows for a very accurate phase calibration of the antenna array.

According to a further preferred implementation form of the first aspect, the evaluation device is adapted to determine a power operating parameter based upon the position information and a relative minimum amplitude of the measured interference signal. This allows for an especially accurate amplitude calibration.

According to a further preferred implementation form of the first aspect, the evaluation device is adapted to perform the evaluation based upon the position information and the measured power of a same time index. Especially, when recording the measurement results including a time index, a very efficient and accurate calibration is achieved.

According to a further preferred implementation form of the first aspect, the evaluation device is adapted to perform a comparison of the measured interference signal to an ideal interference signal. Moreover, the evaluation device is then adapted to determine the operating parameters based on the comparison. This further reduces the computational complexity of determining the calibration.

According to a further preferred implementation form of the first aspect, the measuring device comprises an ideal interference signal determinator, adapted to calculate the ideal interference signal based on the position information. With this approach, a slightly increase of computational complexity, but a significant decrease in required storage capacity for determining the ideal interference signal is achieved.

According to a further preferred implementation form of the first aspect, the measuring device comprises an ideal interference signal storage, adapted to store a plurality of ideal interference signals for a plurality of values of the position information. The evaluation device is then adapted to read the ideal interference signal from the ideal interference signal storage, based upon the position information. With this alternative approach, a significantly reduced computational complexity at the cost of an increased storage capacity is achieved.

According to a further preferred implementation form of the first aspect, the antenna array comprises a plurality of first antennas or first antenna groups. The antenna array moreover comprises a plurality of parameter setting units. Each of the plurality of parameter setting units is connected to one of the plurality of first antennas or first antenna groups. In this case, the measuring system moreover comprises a first switching device, adapted to switch the signal generator between the plurality of parameter setting units. It is thereby possible to calibrate a large number of antennas of the antenna array automatically.

According to a further preferred implementation form of the first aspect, the measuring system is adapted to successively, for all first antennas or first antenna groups, connect one of the plurality of parameter setting devices to the signal generator, using the first switching device, and perform a measurement of the presently connected first antenna or first antenna group with regard to the second antenna or second antenna group. This further increases the amount of automation and thereby decreases the operator time necessary for performing the calibration.

According to a further preferred implementation form of the first aspect, the evaluation device is adapted to determine the operating parameters of all first antennas or first antenna groups jointly, using an optimization calculation. By this approach, a further increase in the accuracy of the calibration is achieved.

According to a further preferred implementation form of the first aspect, the measuring system comprises a plurality of second antennas or second antenna groups. The measuring system then comprises a second switching device, which is adapted to switch the signal generator between the plurality of second antennas or second antenna groups. The measuring system is then adapted to successively, for all first antennas or first antenna groups and at least some of the plurality of second antennas or second antenna groups, connect one of the plurality of parameter setting devices to the signal generator, using the first switching device, connect one of the plurality of second antennas or second antenna groups to the signal generator, using the second switching device, and perform a measurement of the presently connected first antenna or first antenna group with regard to the presently connected second antenna or second antenna group. Also, all second antennas or second antenna groups can be handled accordingly. It is even possible to interchangeably use first antennas or first antenna groups and second antennas or second antenna groups for these measurements. Thereby, an especially accurate calibration can be achieved, since a large amount of redundant data is generated.

According to a further preferred implementation form of the first aspect, the evaluation device is adapted to determine the operating parameters of all first antennas or first antenna groups jointly, using an optimization calculation. Thereby, a further increase in calibration accuracy can be achieved.

According to a further preferred implementation form of the first aspect, the measuring system is adapted to deactivate or attenuate all antennas or antenna groups of the antenna array, which are not involved in a presently performed measurement. This allows for uninterrupted measurements and therefore for a very high measuring accuracy.

According to a second aspect of the invention, a measuring method for calibrating an antenna array is provided. The method comprises generating a first measuring signal, and providing it to a parameter setting unit of a first antenna or first antenna group of the antenna array, and to a second antenna or a second antenna group of the antenna array, receiving a second measuring signal composed of a signal emitted by the first antenna or first antenna group and a signal emitted by the second antenna or second antenna group, measuring the power of the second measuring signal, determining a measured interference signal from the measured power of the second measuring signal.

BRIEF DESCRIPTION OF THE DRAWINGS

Exemplary embodiments of the invention are now further explained by way of example only with respect to the drawings, in which.

DETAILED DESCRIPTION OF THE PREFERRED EMBODIMENTS

Figure 1:
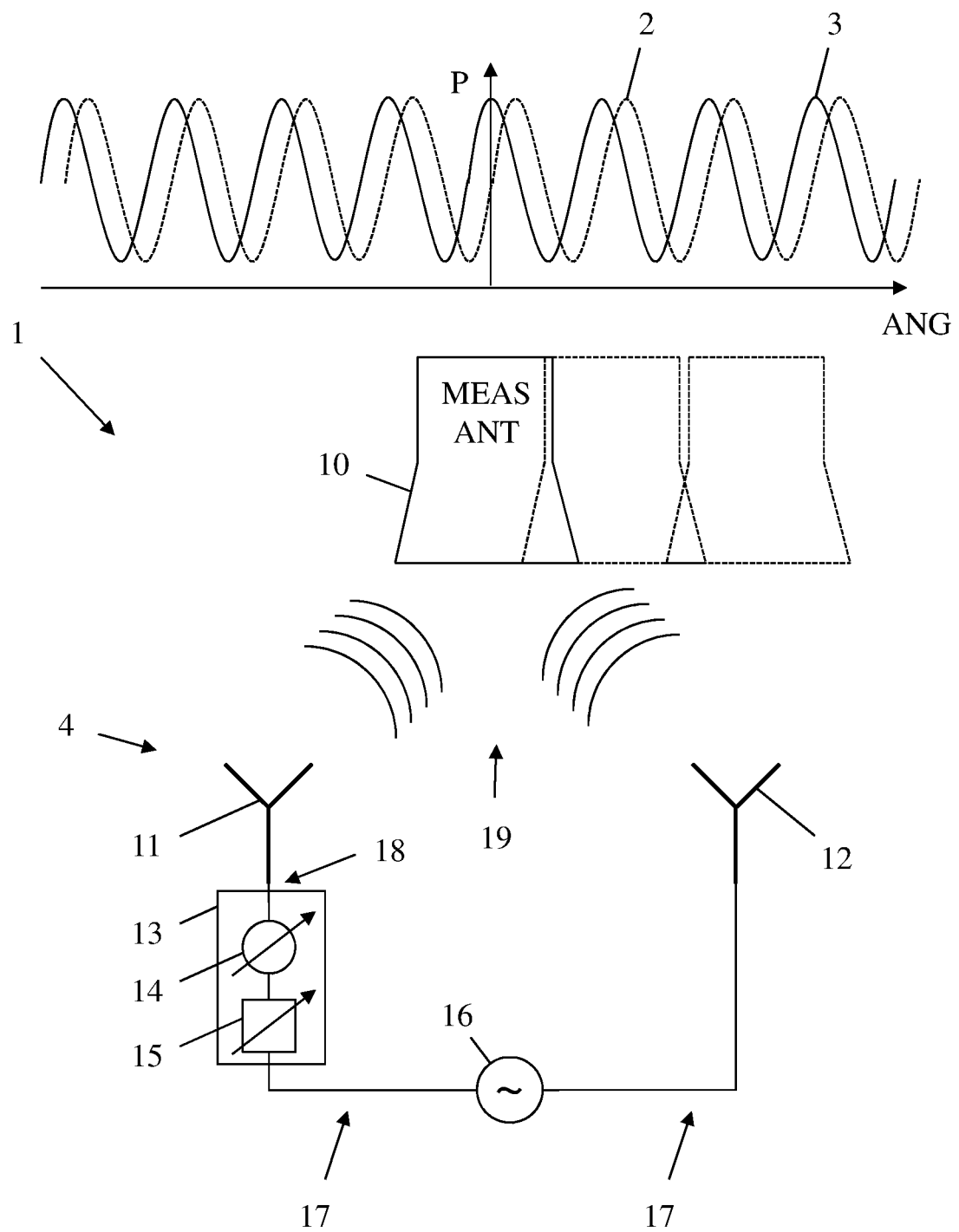
FIG. 1 shows a first embodiment of the measuring system according to the first aspect of the invention.

First, we demonstrate the general construction and function of an embodiment of the measuring system of the first aspect of the invention, along FIG. 1. Along FIG. 2, a further embodiment of the measuring system according to the first aspect of the invention is described in greater detail. Finally, with regard to the flow chart of FIG. 3, an embodiment of the measuring method according to the second aspect of the invention is described. Similar entities and reference numbers in different figures have been partially omitted.

Reference will now be made in detail to the preferred embodiments of the present invention, examples of which are illustrated in the accompanying drawings. However, the following embodiments of the present invention may be variously modified and the range of the present invention is not limited by the following embodiments.

First Embodiment

In FIG. 1, a first embodiment of the measuring system 1 according to the first aspect of the invention is shown. The measuring system 1 comprises an antenna array 4, which again comprises a plurality of antennas 11, 12. Here, only a first antenna 11 and a second antenna 12 are depicted. In reality, such antenna arrays can have up to hundred or even more individual antennas. Also a grouping of antennas is possible. Therefore, if in the following it is referred to a first antenna or a second antenna, also a first antenna group or a second antenna group is meant. An antenna group is characterized by involving identical signals being received and transmitted by all antennas of the antenna group.

The measuring system moreover comprises a measuring antenna 10, which is arranged so that it can receive signals 19 emitted by the antennas 11, 12 of the antenna array 4.

The antenna 11 of the antenna array 4 is moreover connected to a parameter setting unit 13, which comprises an amplitude adjuster 14 and a phase adjuster 15. The parameter setting unit 13 moreover is connected to a signal generator 16, which is also connected to the second antenna 12. Here, the second antenna 12 is depicted without a parameter setting unit, though in reality, often all antennas of the antenna array comprise such a parameter setting unit. Also here, the second antenna 12 may be connected to a parameter setting unit instead of being directly connected to the signal generator 16.

When performing a calibration of the antenna array, the signal generator 16 generates a first measuring signal 17, which is provided to the second antenna 12, directly. The first measuring signal 17 moreover is provided to the parameter setting unit 13, which modifies the first measuring signal 17 by adjusting the phase and/or amplitude, resulting in a modified measuring signal 18. The modified measuring signal 18 is emitted by the first antenna 11, while the first measuring signal 17 is emitted by the second antenna 12.

The emitted modified measuring signal 18 and the emitted first measuring signal 17 combine to a second measuring signal 19, which is received over the air by the measurement antenna. At the position of the measurement antenna 10, the emitted modified measuring signal 18 and the first measuring signal 17 interfere with each other, resulting in an interference signal 3, which is dependent upon the position information of the measurement antenna 10, the first antenna 11 and the second antenna 12, and also dependent upon the operating parameters, by which the parameter setting unit 13 has modified the first measuring signal 17, resulting in the modified measuring signal 18.

This measured interference signal 3 is used for calibrating the first antenna 11. This is done by comparing the measured interference signal to an ideal interference signal 2. The parameters used by the parameter setting unit 13 are adjusted continuously, until the measured interference signal 3 is identical with the ideal interference signal 2. This is further explained along FIG. 2.

In FIG. 1, a single measuring antenna 10 is displayed. In addition, with dashed lines, further measuring antennas or measuring antenna positions are depicted. This means that the measuring system can either comprise a plurality of measuring antennas or one measuring antenna can be moved to a plurality of different locations. Also a combination of both measures is possible. By use of more than one measuring antenna position—be this by using more than one measuring antenna or be this by using a moveable measuring antenna—a further increase in calibration accuracy can be achieved, since identical measurements can be performed for the different measuring antenna positions. The resulting data can be used to especially accurately determine the measured interference signal. Alternatively, all data can be aggregated and used for an optimization calculation.

If more than one first antenna 11 or more than one second antenna 12 are used for the calibration measurements, a first switching device is used for switching the signal generator 16 between a plurality of parameter setting units of the first antennas 11, and/or a second switching device is used for switching the generator 16 between the plurality of second antennas 12.

For performing an optimal calibration, first, all first antennas 11 are measured with respect to a single one of the second antennas 12. Then, all first antennas 11 are measured with regard to a second one of the second antennas 12. This is repeated, until all first antennas 11 are calibrated with regard to all second antennas 12. The resulting data can be used to either verify the calibration, or for a joint optimization calculation.

Second Embodiment

Figure 2:
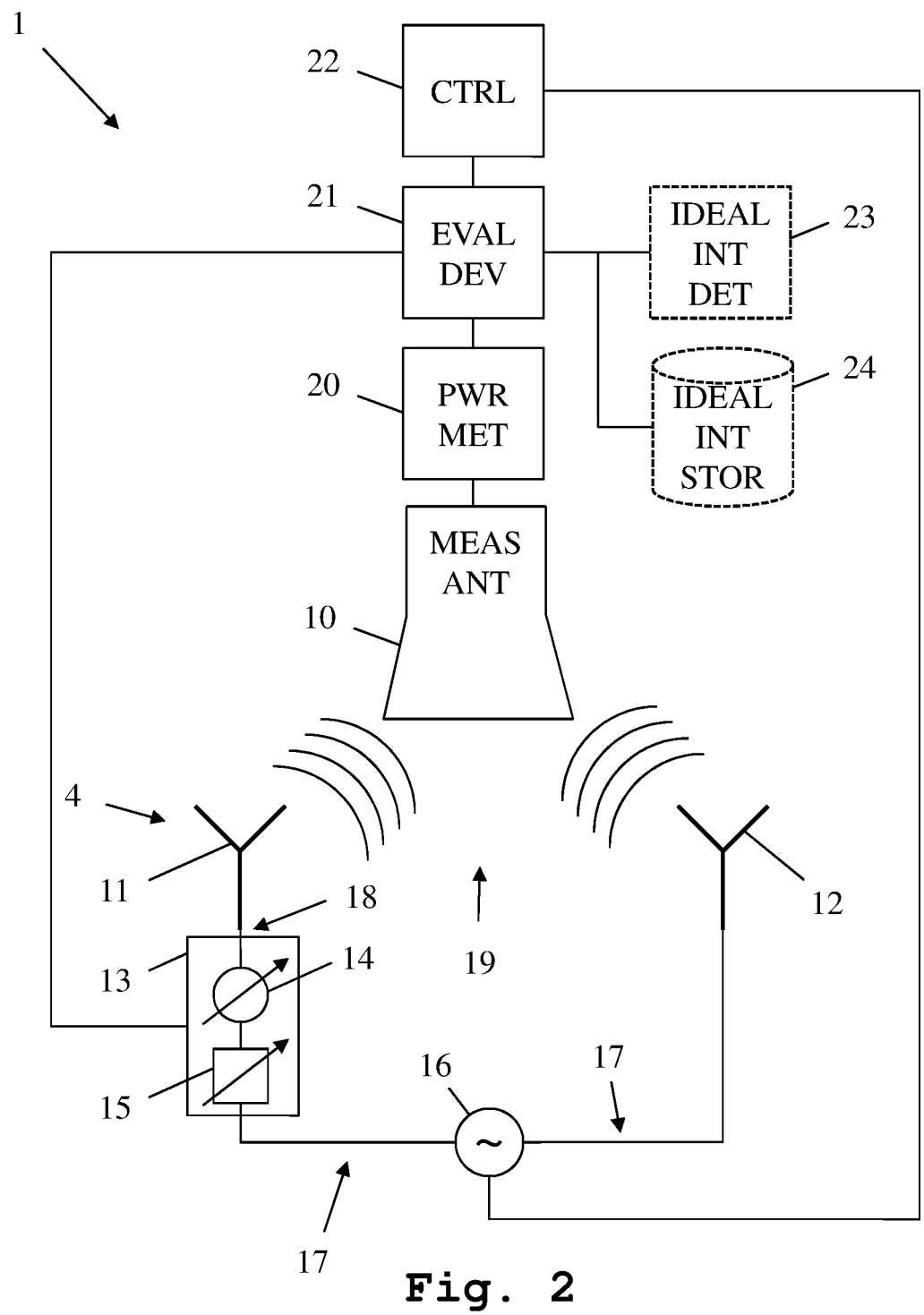
FIG. 2 shows a second embodiment of the measuring system according to the first aspect of the invention.

In FIG. 2, a second embodiment of the measuring system 1 according to the first aspect of the invention is shown. Here, additional components for performing the evaluation are depicted. Identical elements with regard to FIG. 1 are not described in detail, here.

The measuring antenna 10 is connected to a power meter 20, which again is connected to an evaluation device 21, which is moreover connected to a control unit 22. Optionally, the evaluation device 21 is connected to an ideal interference determinator 23. Also optionally, the evaluation device 21 is connected to an ideal interference storage 24.

The control unit 22 is moreover connected to the signal generator 16. The evaluation device 21 is furthermore connected to the parameter setting unit 13.

When performing a measurement, the control unit 22 controls the signal generator 16 to generate the first measuring signal 17. The first measuring signal 17 is emitted by the second antenna 12, directly. The first measuring signal 17 moreover is modified by the parameter setting unit 13 and emitted as modified measuring signal 18.

The parameter is used for modifying the first measuring signal 17 by the parameter setting unit 13 are provided to the parameter setting unit 13 by the evaluation device 21. At the beginning of the measurement, no parameters are provided, resulting therein, that the parameter setting unit 13 does not modify the first measuring signal 17.

Therefore, at the beginning of the measurement, the first antenna 11 also emits the first measuring signal 17 without modification. When the second measuring signal 19, which consists of the modified first measuring signal 18 and the first measuring signal 17 emitted by the second antenna 12, is received by the measuring antenna 10, an interference between the signals 17, 18 occurs, resulting in the second measuring signal 19.

The second measuring signal 19 is received by the measuring antenna 10 and provided to the power meter 20. The power meter 20 determines the power of the received second measuring signal 19 and hands it to the evaluation device 21. The evaluation device then determines a measured interference signal from the measured power of the second measuring signal.

In order to determine the operating parameters used by the parameter setting unit 13, the evaluation device 21 compares the measured interference signal to an ideal interference signal. From this comparison, operating parameters for use by the parameter setting unit 13 are determined and handed to the parameter setting unit 13.

The ideal interference signal is provided to the evaluation device 21 either by the optionally connected ideal interference determinator 23, which directly calculates the ideal interference signal from the position information of the measuring antenna 10, the first antenna 11 and the second antenna 12.

Alternatively, the ideal interference signal is read by the evaluation device 21 from an ideal interference storage 24. In such a storage, a plurality of ideal interference signals for a plurality of values of the location information of the measuring antenna 10, the first antenna 11 and the second antenna 12, are stored. Based upon the present position information, the evaluation device 21 reads the correct ideal interference signal from the storage 24.

When performing the measurements using a digital measuring device, the evaluation device 21 operates in a digital manner. Then, the obtained measurement results are stored along with a time index. Based upon this time index, all further calculations are performed.

The above-described process is optionally repeated, until an optimal calibration of the first antenna 11 is achieved. This can for example be based upon a threshold, evaluated by the evaluation device 21. This preferably means that as soon as the changes to the operating parameters are below a certain threshold, the process is not repeated again.

As already described, real-world antenna arrays can comprise very large numbers of individual antennas. The above-described process is then repeated for each individual antenna of the antenna array used as a first antenna 11. A single antenna of the antenna array 4 is used as a second antenna 12, and therefore as a reference antenna.

In order to further increase the accuracy of the calibration, also the same measurements can be repeated for a number of different reference antennas, also referred to as second antenna 12. This information can be used to either verify, if the measurements match each other, or the individual measurements can be used for a joint optimization calculation, for achieving an optimal calibration of the entire antenna array.

Third Embodiment

Figure 3:
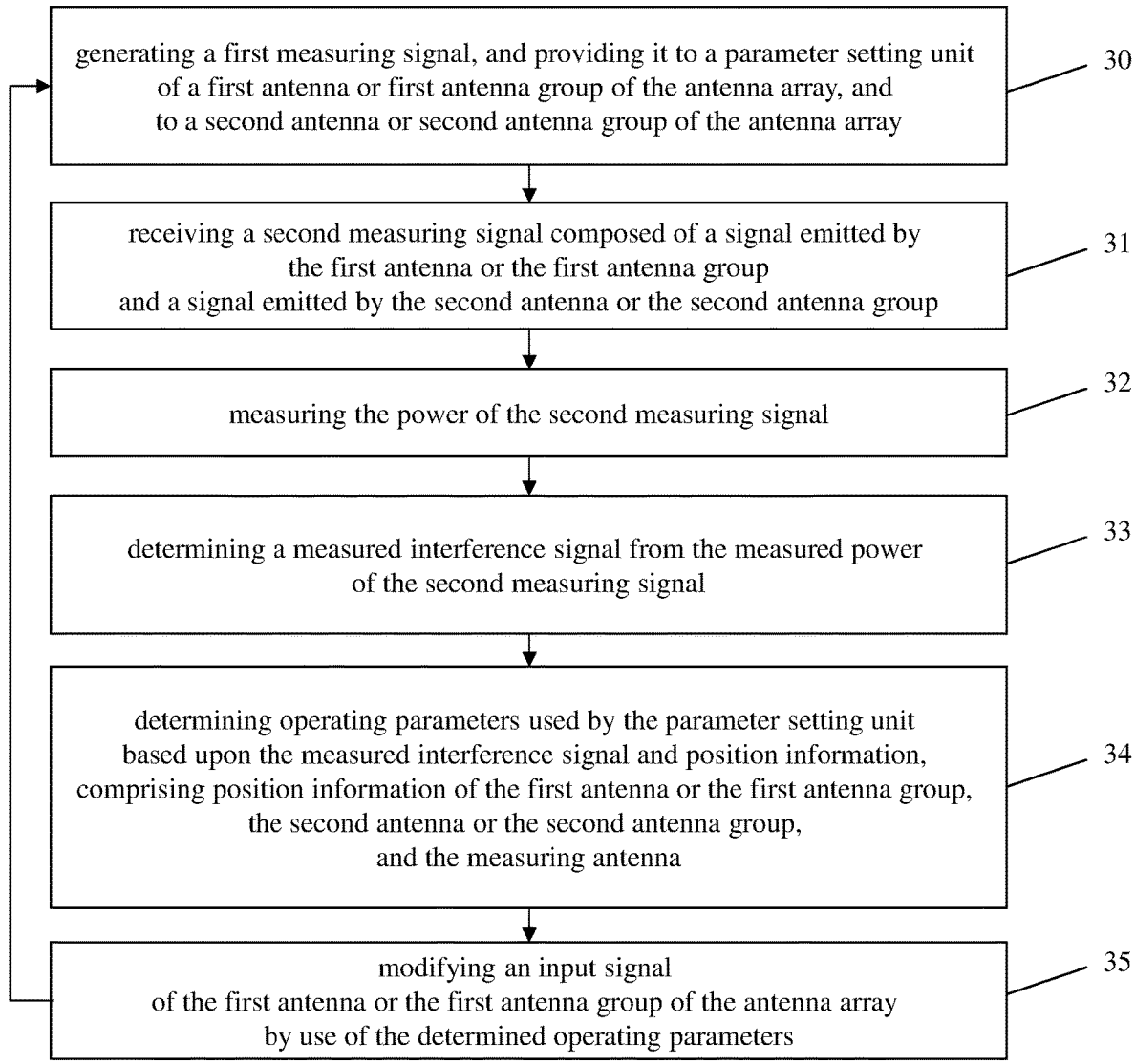
FIG. 3 shows an embodiment of the measuring method according to the second aspect of the invention.

In FIG. 3, an embodiment of the measuring method according to the second aspect of the invention is shown. In a first step 30, a first measuring signal is generated and provided to a parameter setting unit of a first antenna of the antenna array and to a second antenna od the antenna array. In a second step 31, a second measuring signal composed of a signal emitted by the first antenna and signal emitted by the second antenna is received. In a third step 32, the power of the second measuring signal is measured.

In a fourth step 33, a measured interference signal is determined from the measured power of the second measuring signal. In a fifth step 34, operating parameters used by the parameter setting unit are determined based upon the measured interference signal and position information comprising position information of the first antenna, the second antenna and the measuring antenna. In a final sixth step 35, an input signal of the first antenna of the antenna array is modified by use of the determined operating parameters. The process is continued with a further iteration starting at the first step 30, using the modified first measuring signal.

This process is repeated, until either a pre-specified number of iterations has passed, or preferably until changes to the operating parameters are below a pre-specified threshold.

The embodiments of the present invention can be implemented by hardware, software, or any combination thereof. Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

Various embodiments of the present invention may also be implemented in the form of software modules, processes, functions, or the like which perform the features or operations described above. Software code can be stored in a memory unit so that it can be executed by a processor. The memory unit may be located inside or outside the processor and can communicate date with the processor through a variety of known means.

The invention is not limited to the examples and especially not to the use of a specific number of antennas or measuring antennas. The characteristics of the exemplary embodiments can be used in any combination.

Although the present invention and its advantages have been described in detail, it should be understood, that various changes, substitutions and alterations can be made herein without departing from the spirit and scope of the invention as defined by the appended claims.

What is claimed is:

1. A measuring system for calibrating an antenna array, comprising:
    a parameter setting unit, adapted to modify an input signal of a first antenna or first antenna group of the antenna array, by use of operating parameters,
    a signal generator, adapted to generate a first measuring signal, and provide it to the parameter setting unit and/or to a second antenna or second antenna group of the antenna array,
    a measuring antenna, adapted to receive a second measuring signal composed of a signal emitted by the first antenna or the first antenna group and a signal emitted by the second antenna or the second antenna group,
    a power meter, connected to the measuring antenna, adapted to measure the power of the second measuring signal, and
    an evaluation device, adapted to:
        determine a measured interference signal from the measured power of the second measuring signal,
        wherein the first antenna and the second antenna are interchangeable,
    wherein the antenna array comprises a plurality of first antennas or first antenna groups,
    wherein the measuring system comprises a plurality of second antennas or second antenna groups,
    wherein the antenna array comprises a plurality of parameter setting units,
    wherein the measuring system comprises a second switching device, adapted to switch the signal generator between the plurality of second antennas or second antenna groups, and
    wherein the measuring system is adapted to successively, for all first antennas or all first antenna groups and at least some of the plurality of second antennas or second antenna groups:
        connect one of the plurality of parameter setting units to the signal generator, using the first switching device,
        connect one of the plurality of second antennas or second antenna groups to the signal generator, using the second switching device, and
        perform a measurement of the presently connected first antenna or first antenna group with regard to the presently connected second antenna or second antenna group.

2. The measuring system according to claim 1, wherein the evaluation device is further adapted to:
    determine the operating parameters used by the parameter setting unit based upon the measured interference signal and position information, comprising position information of the first antenna or the first antenna group, the second antenna or the second antenna group, and the measuring antenna.

3. The measuring system according to claim 1, wherein the parameter setting unit comprises:
    an amplitude adjuster, adapted to adjust an amplitude of the first measuring signal or a signal derived from the first measuring signal, or
    a phase adjuster, adapted to adjust a phase of the first measuring signal or a signal derived from the first measuring signal.

4. The measuring system according to claim 1,
    wherein the at least one measuring antenna is movable, or
    wherein the measuring system comprises more than one measuring antenna.

5. The measuring system according to claim 4,
    wherein the measuring system is adapted to perform measurements for each measuring antenna position or for each measuring antenna, and
    wherein the evaluation device is adapted to determine the operating parameters based upon results of all measurements.

6. The measuring system according to claim 2,
wherein the evaluation device is adapted to determine a phase operating parameter based upon the position information and an ideal interference signal.

7. The measuring system according to claim 2,
wherein the evaluation device is adapted to determine a power operating parameter based upon the position information and a relative minimum amplitude of the measured interference signal.

8. The measuring system according to claim 1,
wherein the evaluation device is adapted to perform an evaluation based upon the position information and the measured power of a same time index.

9. The measuring system according to claim 2, wherein the evaluation device is adapted to:
perform a comparison of the measured interference signal to an ideal interference signal, and
determine the operating parameters based on the comparison.

10. The measuring system according to claim 9,
wherein the measuring device comprises an ideal interference signal determinator, adapted to calculate the ideal interference signal based on the position information.

11. The measuring system according to claim 9,
wherein the measuring device comprises an ideal interference signal storage, adapted to store a plurality of ideal interference signals for a plurality of values of the position information, and
wherein the evaluation device is adapted to read the ideal interference signal from the ideal interference signal storage, based upon the position information.

12. The measuring system according to claim 1,
wherein each of the plurality of parameter setting units is connected to one of the plurality of first antennas or first antenna groups, and
wherein the measuring system comprises a first switching device, adapted to switch the signal generator between the plurality of parameter setting units.

13. The measuring system according to claim 12,
wherein the measuring system is adapted to successively, for all first antennas or first antenna groups:
connect one of the plurality of parameter setting units to the signal generator, using the first switching device, and
perform a measurement of the presently connected first antenna or first antenna group with regard to the second antenna.

14. The measuring system according to claim 13,
wherein the evaluation device is adapted to determine the operating parameters of all first antennas or all first antenna groups jointly, using an optimization calculation.

15. The measuring system according to claim 12,
wherein the evaluation device is adapted to determine the operating parameters of all first antennas or first antenna groups jointly, using an optimization calculation.

16. The measuring system according to claim 1,
wherein the measuring system is adapted to deactivate or attenuate all antennas or antenna groups of the antenna array, which are not involved in a presently performed measurement.

* * * * *